United States Patent

Fujimoto et al.

Patent Number: 5,809,408
Date of Patent: Sep. 15, 1998

[54] VARIABLE GAIN CIRCUIT AND RADIO APPARATUS USING THE SAME

[75] Inventors: Ryuichi Fujimoto, Tokyo-To; Hiroshi Tanimoto, Kawasaki, both of Japan

[73] Assignee: Kabushiki Kaisha Toshiba, Kawasaki, Japan

[21] Appl. No.: 525,061

[22] Filed: Sep. 8, 1995

[30] Foreign Application Priority Data

Sep. 9, 1994 [JP] Japan .................................. 6-215612

[51] Int. Cl.[6] .............................. H03G 3/00; H03F 3/68
[52] U.S. Cl. .................................. 455/234.2; 455/241.1; 455/245.2; 330/129
[58] Field of Search .............................. 455/232.1, 234.1, 455/241.1, 245.2, 253.2, 248.1, 234.2, 236.1, 239.1, 240.1, 245.1, 249.1, 250.1, 251.1, 252.1, 253.1; 330/124 R, 129, 302; 333/124, 126, 129, 132, 32

[56] References Cited

U.S. PATENT DOCUMENTS

| | | | |
|---|---|---|---|
| 3,654,566 | 4/1972 | Wellhausen et al. | 330/124 R |
| 4,598,252 | 7/1986 | Andricos | 330/124 R |
| 4,794,343 | 12/1988 | Yang | 330/124 R |
| 4,851,796 | 7/1989 | Hendriks | 333/129 |
| 4,855,614 | 8/1989 | Maitre | 330/124 R |
| 5,233,634 | 8/1993 | Vaisanen | 455/234.1 |

FOREIGN PATENT DOCUMENTS

| | | |
|---|---|---|
| 0 622 638 | 11/1994 | European Pat. Off. . |
| 0 658 977 | 6/1995 | European Pat. Off. . |
| 2 071 945 | 9/1981 | United Kingdom . |

OTHER PUBLICATIONS

Tanaka et al., "Low Noise, Low–Distortion Front–End IC for 1–1–V Paging Receiver", IEEE Transactions On Consumer electronics, vol. 37, No. 3, pp. 578–584, (1990).

Patent Abstract of Japan No. JP–A–01 204477 (NEC Corp), Aug. 1989, vol. 013, No. 507 (E–845), Nov. 1989.

Primary Examiner—Reinhard J. Eisenzopf
Assistant Examiner—Lester G. Kincaid
Attorney, Agent, or Firm—Foley & Lardner

[57] ABSTRACT

A gain switching circuit comprises first and second gain stages connected in parallel between the input terminal and the output terminal, and a control unit for allowing the first and second gain stages to be selectively operative, wherein the first and second gain stages respectively include input sections in which input impedance values viewed from the input terminal are substantially equal to each other, and output sections in which output impedance values viewed from the output terminal are substantially equal to each other. By this configuration, a gain switching circuit and a radio apparatus using such a gain switching circuit adapted so that input/output impedance does not fluctuate are provided without implementing switching between gain stages.

11 Claims, 14 Drawing Sheets

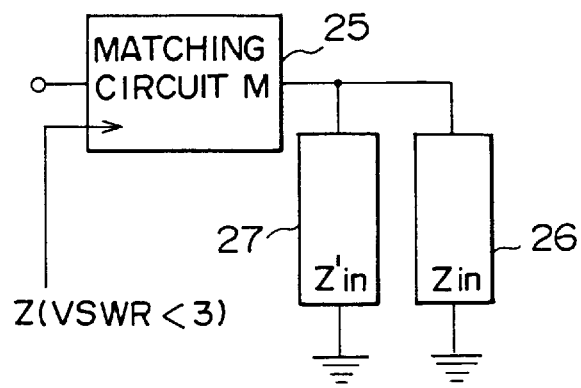
F I G. 5
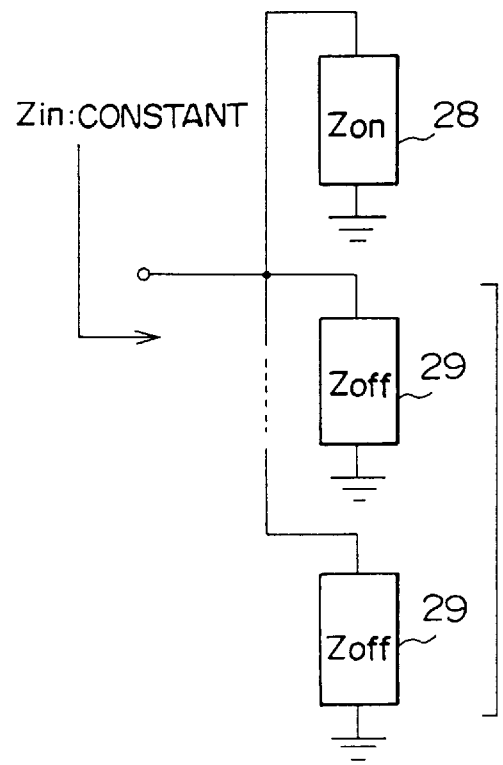
F I G. 6

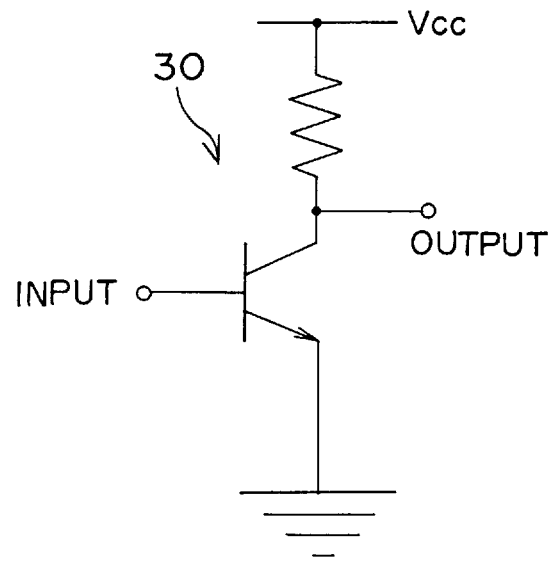
F I G. 7
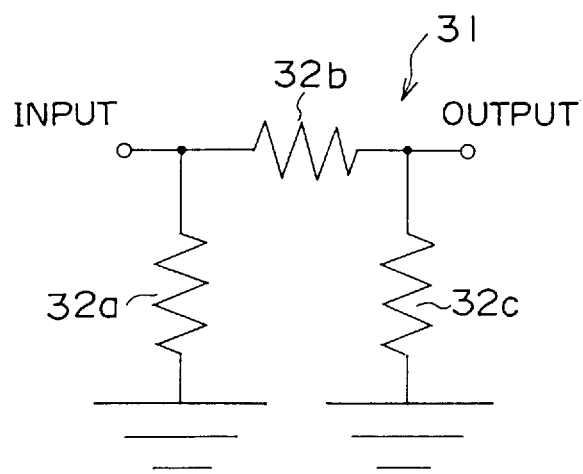
F I G. 8

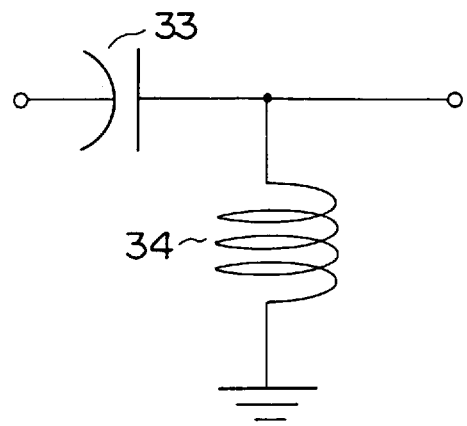
F I G. 9
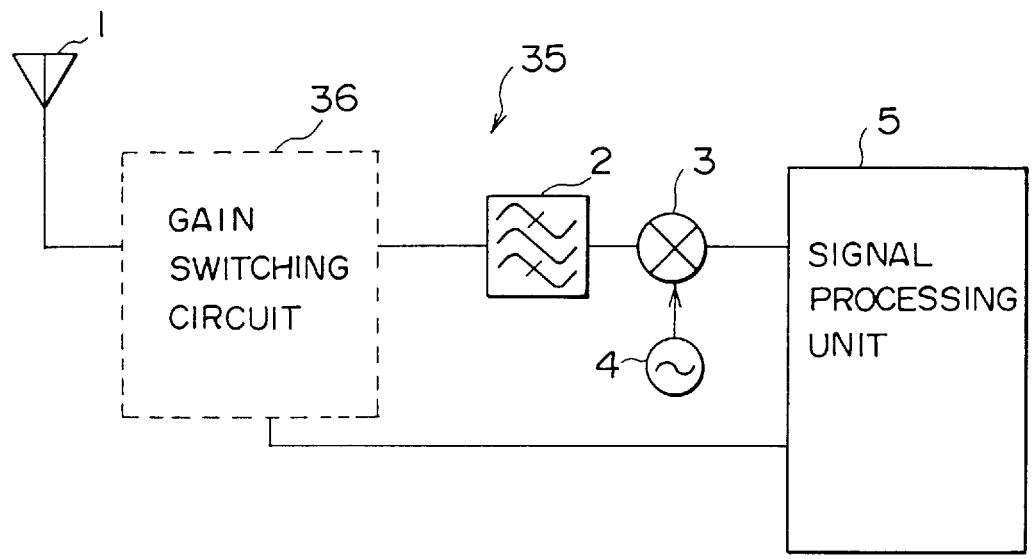
F I G. 10

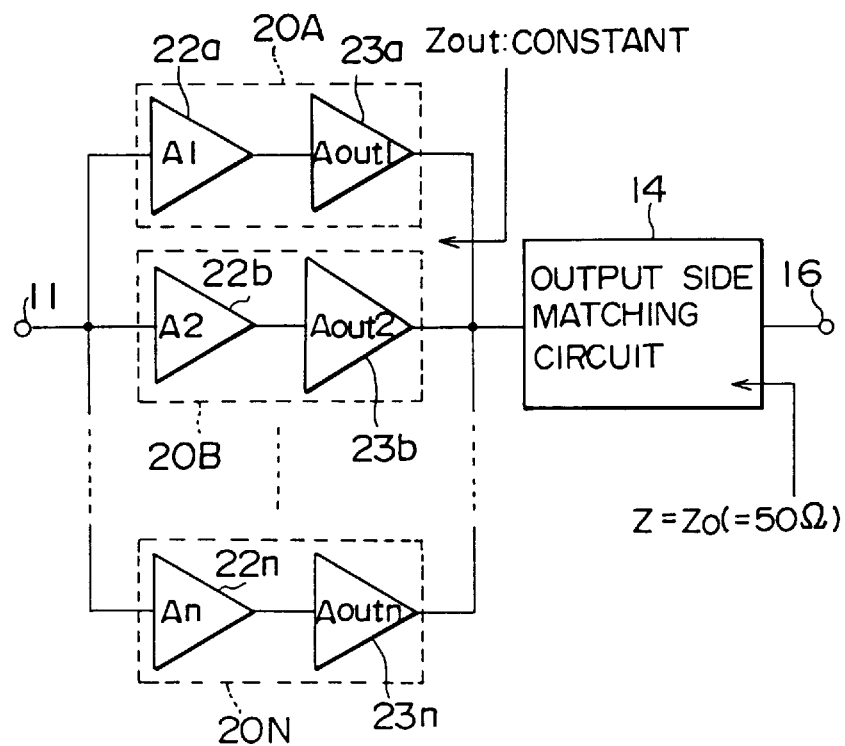
F I G. 11
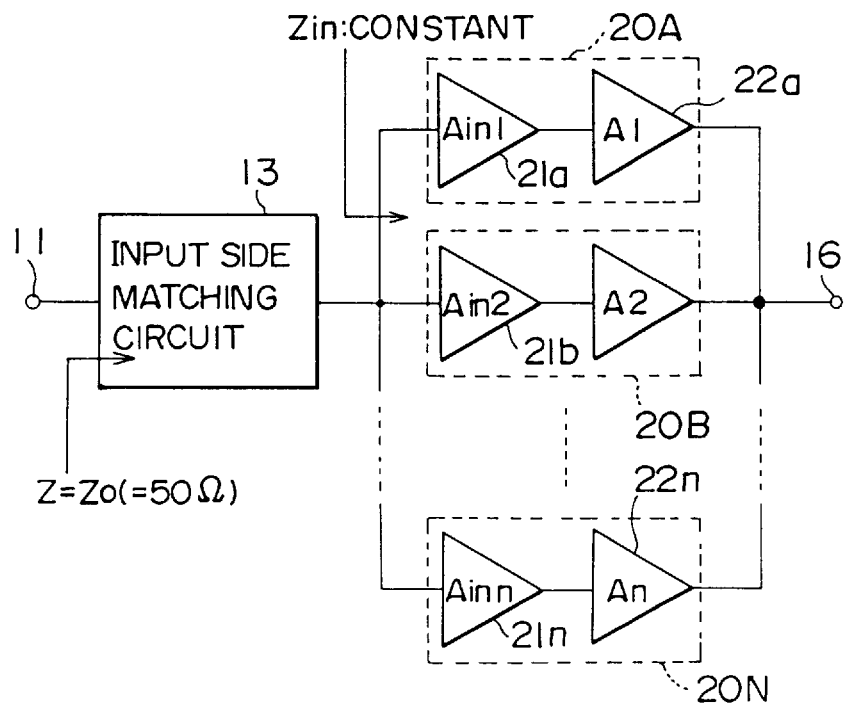
F I G. 12

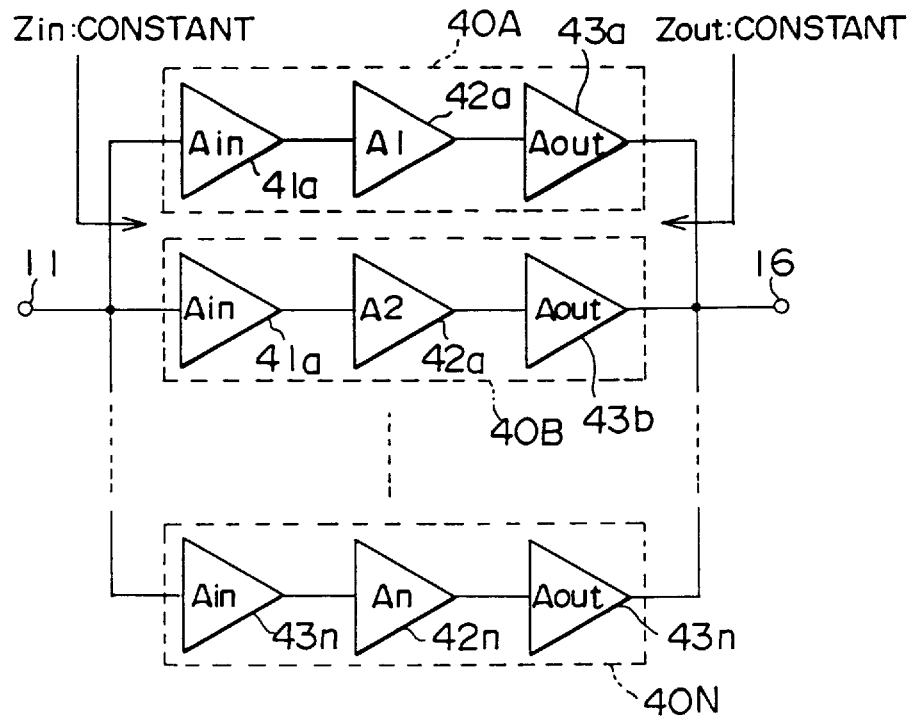
F I G. 13
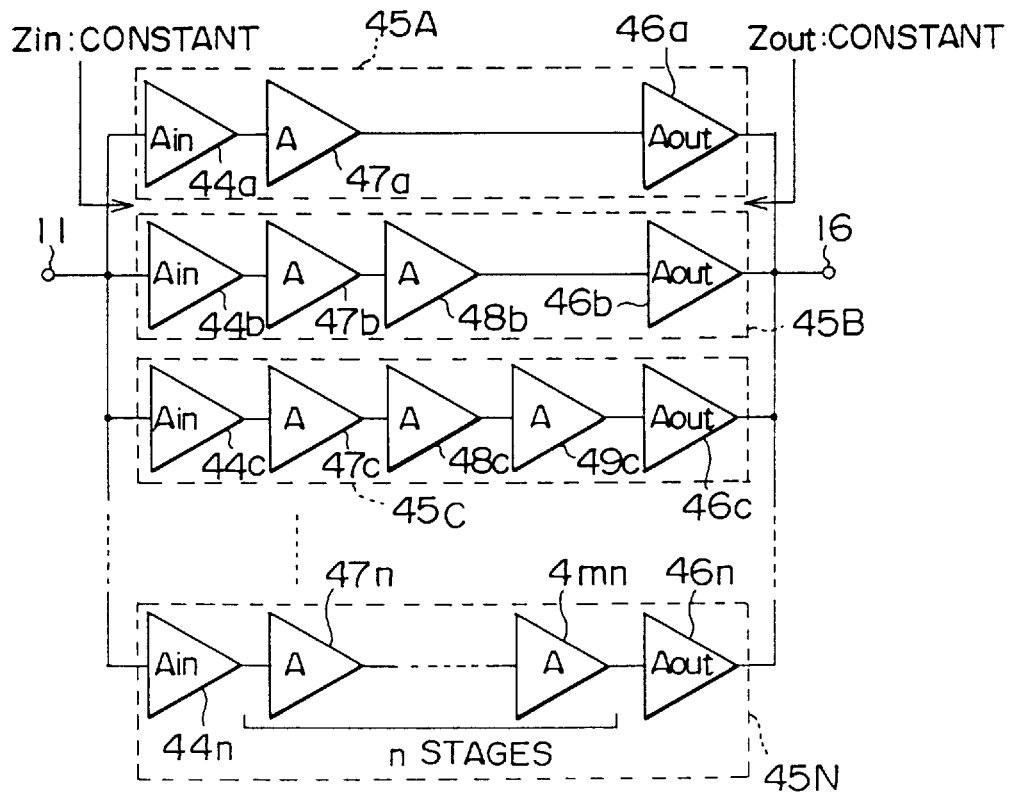
F I G. 14

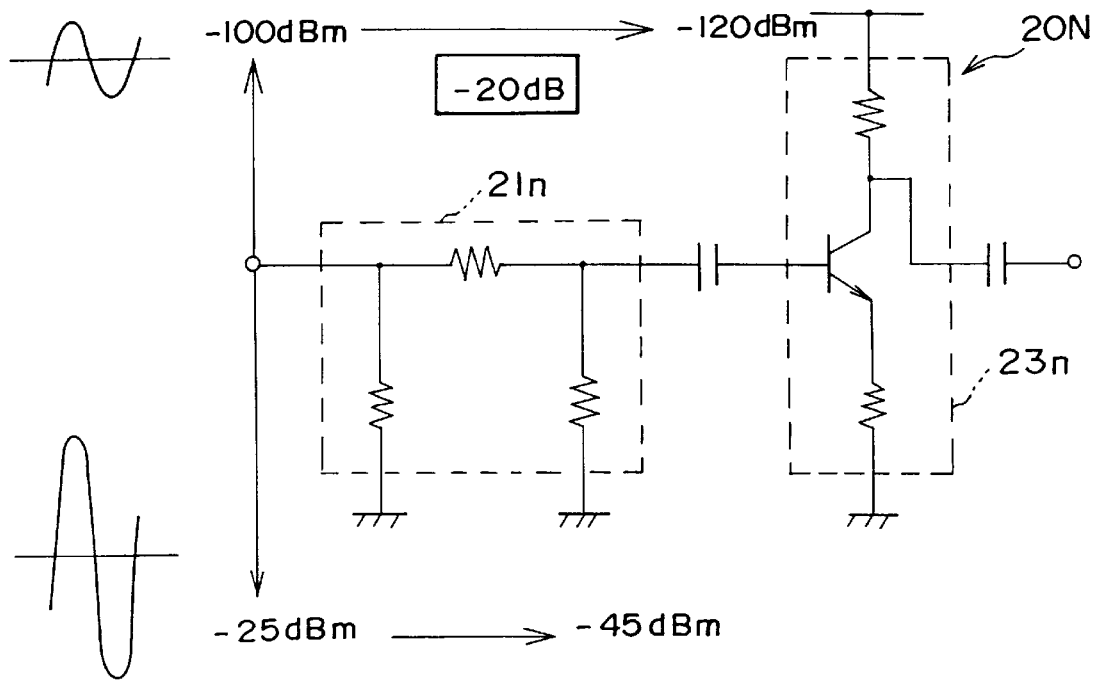
F I G. 19
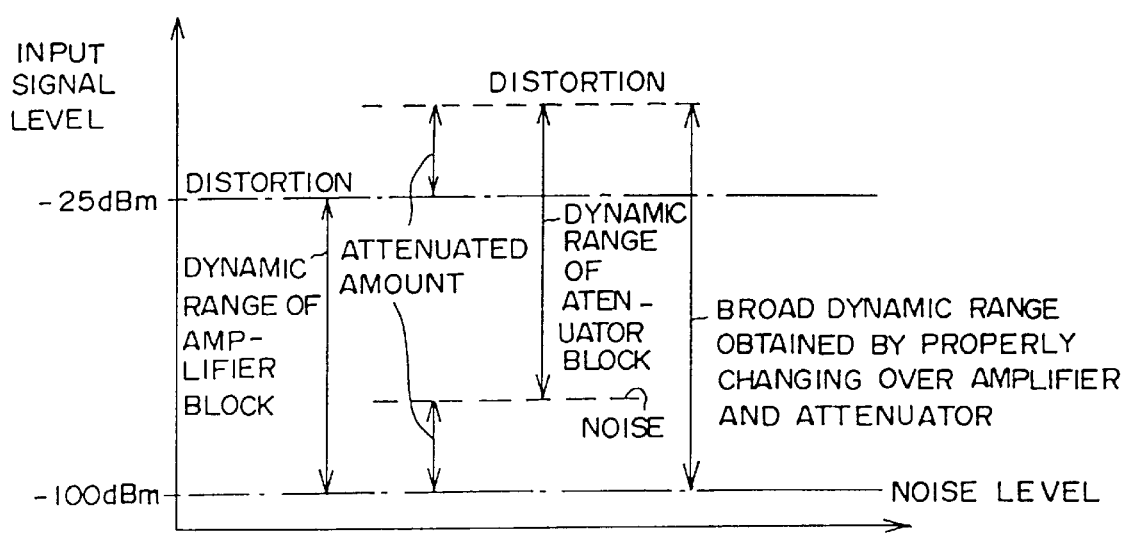
F I G. 20

VARIABLE GAIN CIRCUIT AND RADIO APPARATUS USING THE SAME

BACKGROUND OF THE INVENTION

The present invention relates to a variable gain circuit for switching a plurality of gains and a radio apparatus using such the variable gain circuit.

In order to broaden the dynamic range in a radio (wireless) apparatus, it is effective to control gain. In FIG. 1 showing a conventional radio receiver, the receiver comprises, for example, an antenna 1 for inputting a receiving signal externally transmitted, a conventional amplifier 10 for amplifying the receiving signal, a bandpass filter 2 for passing through a predetermined frequency band of the receiving signal, a frequency converter 3 for converting a frequency of the receiving signal, a local oscillator 4 for outputting a local oscillating signal, and a signal processing unit for processing a frequency converted signal. In this case, the level of a signal inputted from the antenna 1 diversely changes. If gain of the amplifier 10 is not variable, distortion may take place with respect to an excessive input signal, and/or noise characteristic may become poor with respect to a very small input signal. Accordingly, it is desirable that the amplifier has variable gain so as to make attenuation with respect to an excessive input signal, and to make amplification with respect to a very small input signal.

The amplifier 10 comprises an input terminal, first through n-th amplifier stages 12a–12n connected in parallel with one another, and an output terminal 16. Each amplifier stage 12 comprises an input side matching circuit 13, a gain stage 14, and an output side matching circuit 15. Accordingly, respective stages are matched with an input side and output side by the matching circuits 13 and 15 to finally supply the optimum receiving signal for the signal processing unit 5.

Moreover, as shown in FIG. 1, the antenna 1 and/or filter 2, etc. are generally disposed before and after the amplifier 10. Since these parts (circuit components) are designed on the basis of a predetermined characteristic impedance $Z_0$ (generally 50 ohms, and hereinafter the characteristic impedance is assumed to be 50 ohms), if the input impedance or the output impedance of the amplifier is not set to 50 ohms, antenna and/or filter disposed before and after the amplifier do not exhibit desired performance. However, since generally the input/output impedance of the amplifier itself is not in correspondence with 50 ohms, matching circuits 13 and 15 as shown in FIG. 2 are used to convert (change) the input impedance or the output impedance of the amplifier into 50 ohms.

Here, a typical matching circuit serves to convert a certain impedance into a desired impedance at a predetermined frequency. Accordingly, if frequency changes, or input impedance or output impedance of the amplifier itself changes, it is difficult to maintain matching.

Hitherto, an electronic circuit for carrying out switching between plural gains is of a structure in which switching between gain stages is made by switches, or is of a structure in which respective gain stages are connected in parallel as shown in FIG. 1. When the switches are provided to the amplifier 10, for example, switches 17 and 18 are connected before the matching circuit 13 and after the matching circuit 15, respectively.

The operation of the circuit shown in FIG. 1 will be first described. In the case where the gain is set to A1 in the circuit of FIG. 1, switches SWout1 of the first stage (denoted by reference numerals 17 and 18) are turned ON, and other switches of other stages (denoted by reference numerals 17 and 18) are all turned OFF. Similarly, in the case where the gain is set to A2 in the second stage, switches SWin2 (17) and SWout2 (18) are turned ON, and other switches are all turned OFF in other stages. Since this gain selecting method utilizes switches, elements for constituting switch such as an FET (field effect transistor) are required in order that those switches are formed (configured) within an IC (integrated circuit). For this reason, it was necessary to use GaAs process or BiCMOS process of high cost. Further, there are also instances where the characteristic of the entirety of the circuit might be degraded in dependency upon performance of the switch.

In addition, for the previously described reason, from a practical point of view, it is necessary to prepare matching circuits (not shown) every respective gain stages. Since the matching circuit which is generally comprised of passive elements takes large occupation area within IC, there also results the problem that the chip area would be increased.

On the other hand, in the case where switches are not integrated within IC, switches of externally attached parts are used. However, when externally attached parts are used, there takes places the problem that the area is increased and/or the cost becomes high.

The operation of the circuit will not be described. In order to set the gain to A1 in the circuit, as shown in FIG. 1 only the first gain stage including amplifier 14 is turned ON and other gain stages are all turned OFF. Similarly, in order to set the gain to A2, only the second gain stage including amplifier 14 is turned ON and other gain stages are all turned OFF. Since this gain selecting method does not use switch, it can be realized even by inexpensive process having no FET like bipolar process. However, since the input and output impedance values of the circuit change to much degree in dependency upon a gain stage of which bias is turned ON (i.e., a selected gain stage), it is difficult to allow the input and output impedance values of the circuit to match with a desired impedance value even if which gain stage is selected.

Further, in circuits as shown in FIG. 1, characteristics of respective gain stages fluctuate without conducting tracking (following) with respect to variations (unevenness) of the process.

In the circuit adapted for carrying out switching between plural gains, in the case where gain switching is carried out by using switch, performance of the entirety of the circuit became poor in dependency upon performance of the switch, or it was necessary to use GaAs process or BiCMOS process of high cost because a switch was used.

In addition, with respect to impedance matching, in the case where switch is used, it is necessary to provide different matching circuits for every respective stage, resulting in large chip area. On the other hand, in the case where no switch is used, even if a particular gain stage is selected, it is difficult to match impedances which would result in a constant (fixed) impedance.

SUMMARY OF THE INVENTION

With the above-described problems in view, an object of this invention is to realize, by a cheap bipolar process, without use of switch, a gain switching means adapted so that input and output impedance values of the amplifier do not change even if a particular gain stage is selected, and that it is thus sufficient to provide matching circuits respectively on the input side and on the output side.

A variable gain circuit according to this invention is characterized in that, in gain stages connected in parallel, input impedance values of circuits nearest to the input side and output impedance values of circuits nearest to the output side are caused to be substantially the same at all gain stages, thereby permitting input and output impedance values to be substantially constant even when what gain stage is selected.

Generally, depending on whether power is delivered to an electronic circuit and whether no power is delivered thereto, magnitudes of the input impedance and the output impedance of the electronic circuit greatly change. Similarly, also depending on changes in supply states of the bias power or the bias current from a bias circuit for setting the operating state of the electronic circuit, the input/output impedance of the circuit may fluctuate.

The variable gain circuit of this invention is adapted so that predetermined signal amplification factors are determined in accordance with amplification factors of the amplifying sections of plural gain stage blocks to select any one of respective gain stage blocks, thereby making it possible to obtain a desired amplification factor. In this case, since even if a particular gain stage is selected, only one gain stage is caused to be in ON state and other all gain stages are caused to be in OFF state, the input impedance and the output impedance of the entirety of the variable gain stage are always substantially constant (fixed) even if a particular gain stage is selected, i.e., irrespective of the gain stage selected. For this reason, it is unnecessary to individually provide different matching circuits at respective gain stages. When one matching circuit is used as the entirety of the variable gain circuit, it is possible to match with a desired impedance even if a particular gain stage block is selected.

As a result, the total number of matching circuits which generally occupy large area within the Integrated Circuit (IC) can be decreased. Thus, the chip area can be reduced as a whole. Moreover, since it is possible to simultaneously realize the gain switching function and the impedance matching function, without use of connection switch, gain switching circuit can be put into practice even with relatively cheap process such as typical bipolar process.

As described above, in accordance with this invention, in a variable gain circuit having a plurality of gain stages, it becomes easy to match impedances with external circuits connected to the input side and the output side, and the number of matching circuits can be reduced.

In addition, since a switch for gain switching is not used, this variable gain circuit can be realized with an inexpensive process such as typical bipolar process.

BRIEF DESCRIPTION OF THE DRAWINGS

In the accompanying drawings:

FIG. 5 is a view for explaining the principle of the variable gain circuit of this invention;

FIG. 6 is a view for explaining the principle of the variable gain circuit of this invention, FIG. 7 is a view showing an example of the configuration of an element circuit of the gain stage of the variable gain circuit of this invention;

FIG. 8 is a view showing another example of the configuration of an element circuit of the gain stage of the variable gain circuit of this invention;

FIG. 9 is a view showing an example of the configuration of a matching circuit used in the variable gain circuit of this invention;

FIG. 10 is a view showing an example of the configuration in which the variable gain circuit of this invention is applied to a radio receiver;

FIG. 11 is a view showing the configuration of a first application example of the variable gain circuit of this invention;

FIG. 12 is a view showing the configuration of a second application example of the variable gain circuit of this invention;

FIG. 13 is a view showing the configuration of a third application example of the variable gain circuit of this invention;

FIG. 14 is a view showing the configuration of a fourth application example of the variable gain circuit of this invention;

FIG. 19 is an equivalent circuit diagram for explaining a principle of the present invention;

FIG. 20 is a characteristic diagram for explaining a principle of the present invention.

DETAILED DESCRIPTION OF THE PREFERRED EMBODIMENTS

Figure 1:
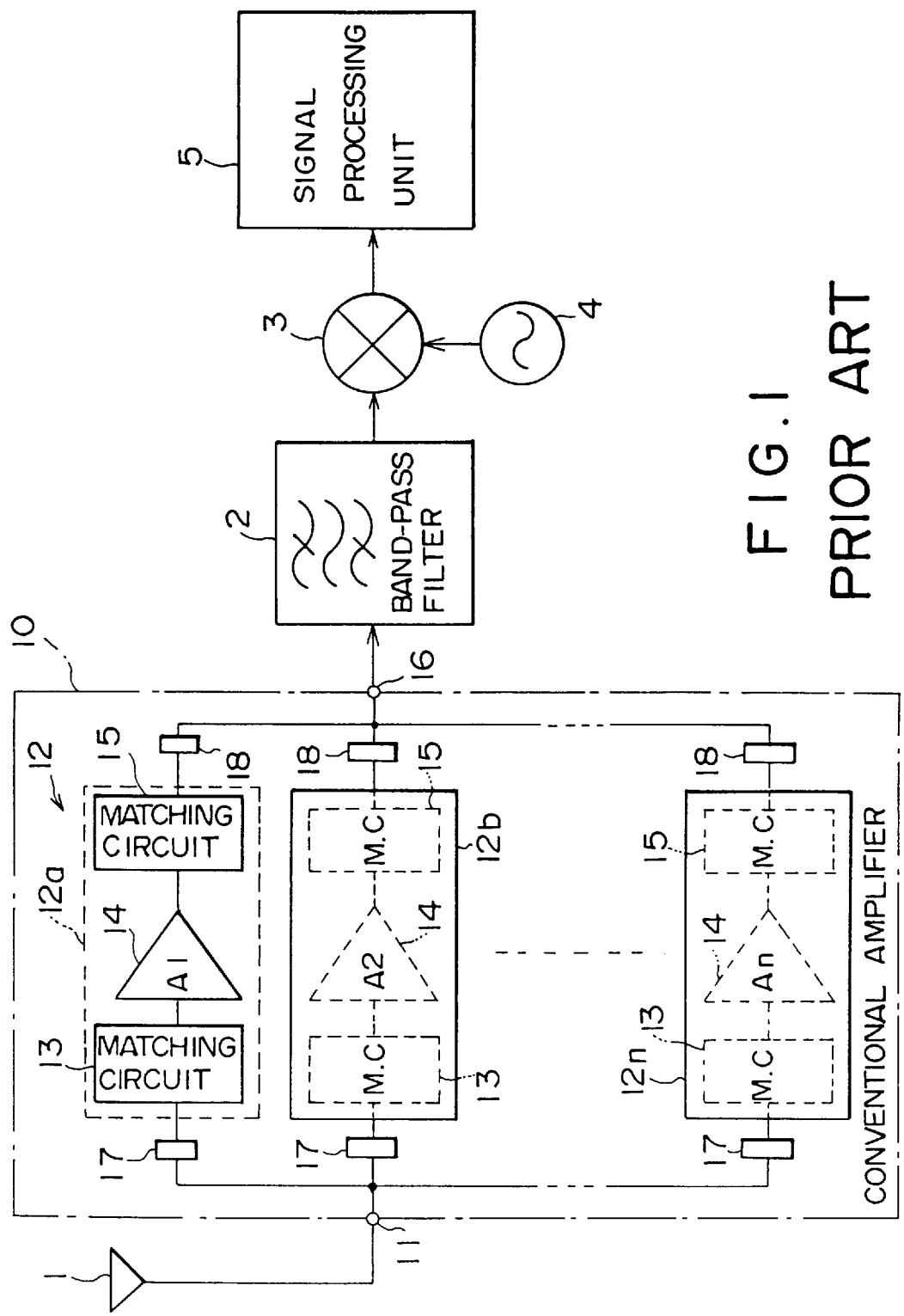
FIG. 1 is a view showing the configuration of a conventional radio receiver.
Figure 2:
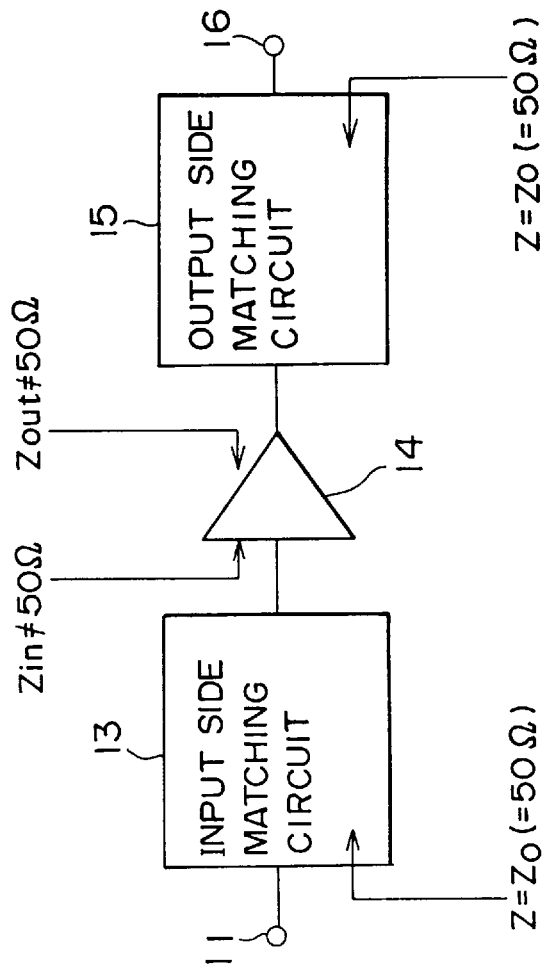
FIG. 2 is a view showing the configuration of a conventional variable gain circuit and matching circuits on the input side and on the output side thereof.

There will be described a variable gain circuit and a radio apparatus using the same according to preferred embodiments the present invention in reference with the attached drawings.

At first, before the description of the preferred embodiment, the fundamental configuration of the variable gain circuit of this invention will now be described with reference to FIG. 3. Reference numerals 20A, 20B, . . . , and 20C denote plural different gain stage blocks. In respective gain stage blocks, input sections 21a, 21b, . . . , and 21n, amplifying sections 22a(A1), 22b(A2), . . . , and 22n(An), and output sections 23a, 23b, . . . , and 23n, etc. are included.

As shown in FIG. 6, plural gain stage blocks are connected in a parallel fashion to thereby constitute a variable gain stage as a whole, and a matching circuit 13 of the input side and a matching circuit 14 of the output side are respectively connected before and after the variable gain stage.

In the above-mentioned fundamental configuration, an input circuit section is constituted so that input impedance values of the circuit portions (input sections 21a, 21b, . . . , and 21n of the gain stage blocks 20A–20N) nearest to the signal input terminal 11 included in the individual gain stage blocks 20A, 20B, . . . , and 20N are substantially equal to each other, and an output circuit section is constituted so that output impedance values of the circuit portions (output sections 23a, 23b, . . . , and 23n of the gain stage blocks 20A–20N) nearest to the signal output terminal 12 are substantially equal to one another. When consideration is made in connection with the input impedance values and the output impedance values of the individual gain stage blocks, the input impedance of the entirety of the variable gain stage is affected to the maximum degree by input impedance values of the circuits nearest to the signal input terminal, i.e., the circuits of the input sections of respective gain stages, and the output impedance of the entirety of the variable gain stages is affected to the maximum degree by output impedance values of the circuit nearest to the signal output terminal, i.e. the circuits of the output sections of respective gain stages. On the contrary, input impedance values and output impedance values, etc. of the amplifying section circuits provided between the input sections and the output sections of the gain stage blocks have less influence on the input impedance and the output impedance of the entirety of the variable gain stage.

Generally, when power is delivered to an electronic circuit and when no power is delivered thereto, magnitudes of the input impedance and the output impedance of the electronic circuit greatly change. Similarly, depending upon changes in supply states of the bias power or the bias current from a bias circuit for setting the operating state of the electronic circuit, the input/output impedance of the circuit may fluctuate.

The gain switching circuit of this invention is adapted so that predetermined signal amplification factors are determined depending upon amplification factors of the amplifying sections of plural gain stage blocks to select any one of respective gain stage blocks, thereby making it possible to obtain a desired amplification factor. In this case, only one gain stage is caused to be in ON state and other all gain stages are caused to be in OFF state, the input impedance and the output impedance of the entirety of the variable gain stage are always substantially constant (fixed) even if a particular gain stage is selected, i.e., irrespective of the gain stage selected. For this reason, it is unnecessary to individually provide different matching circuits at respective gain stages. When one matching circuit is used as the entirety of the gain switching circuit, it is possible to match with a desired impedance even if a particular gain stage block is selected.

As a result, the total number of matching circuits which generally occupy large area within the Integrated Circuit (IC) can be decreased. Thus, the chip area can be reduced as a whole. Moreover, since it is possible to simultaneously realize the gain switching function and the impedance matching function without use of connection switch, the variable gain circuit can be implemented even with a relatively inexpensive process such as a typical bipolar process.

Figure 3:
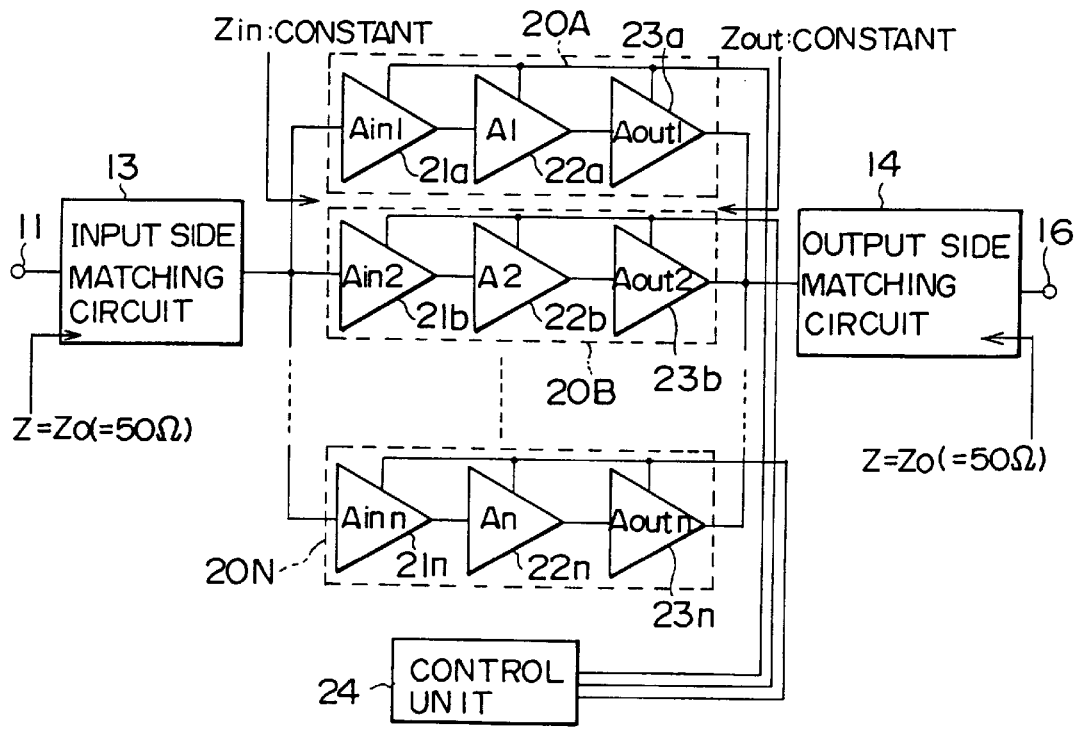
FIG. 3 is a view showing the fundamental configuration of a variable gain circuit of this invention.

The fundamental configuration of the variable gain circuit of this invention is shown in FIG. 3. Respective input impedance values of circuits nearest to the input side (input sections 21a, 21b, . . . , and 21n) and output impedance values of circuits nearest to the output side (output sections 23a, 23b, . . . , and 23n) of respective gain stage blocks 20A, 20B, . . . , and 20N were caused to be substantially the same at all gain stages, wherein a control unit 24 carries out selection of gain stage block in accordance with a desired gain.

Figure 4:
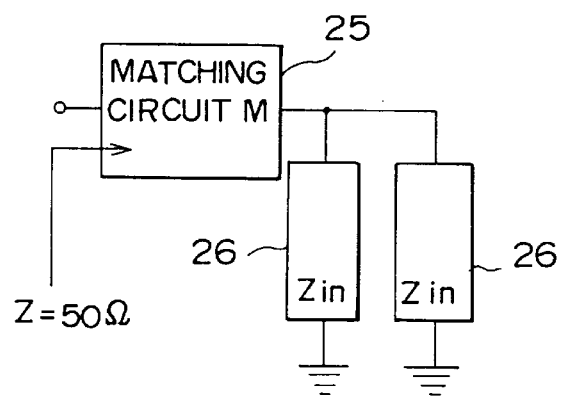
FIG. 4 is a view for explaining the principle of the variable gain circuit of this invention.

The reason for employing the configuration in which input impedance values are caused to be substantially the same will now be described with reference to FIGS. 4 and 5. For the brevity of explanation, it is assumed that consideration is made in connection with two circuits, and it is further assumed that one input impedance is Zin and the other input impedance is Zin. Initially, as shown in FIG. 4, a matching circuit 25 adapted to allow impedance to match with the characteristic impedance 50 ohms is connected to two circuits 26 and 26 of input impedance Zin connected in parallel. When there results such a state, no reflection of an input signal at the input terminal takes place.

Then, as shown in FIG. 5, a matching circuit 25 is connected to a circuit comprising a circuit 26 of input impedance Zin and a circuit 27 of input impedance Zin' connected in parallel. Here, if this circuit arrangement has an input impedance Zm such that the voltage standing wave ratio (VSWR) at the input terminal is expressed as "VSWR<3", since power reflected at the input terminal is less than one half, Zin and Zin' are considered to be substantially the same impedance.

In the case where the gain stage 20A is selected in the circuit of FIG. 3, the control unit 24 is caused to be operative so that only the gain stage 20A is turned ON and other gain stages 20B–20N are all turned OFF. At this time, the gain of the circuit of FIG. 3 is expressed as Ain+A1+Aout [dB]. Moreover, the input impedance and the output impedance of this circuit are substantially determined by the input impedance values of circuits nearest to the input side and the output impedance values of circuits nearest to the output side of respective gain stages. In the case of the circuit of FIG. 3, only one gain stage selected of the circuits nearest to the input side of respective gain stages is in ON state, and circuits of other gain stages are all in OFF state. Input impedance of the circuit of FIG. 6 is equal to a value when input impedance (Zon) of one input side circuit in ON state denoted by reference numeral 28 and input impedance (Zoff) of (n−1) input side circuits in OFF state denoted by reference numeral 29 are connected in parallel. This state is the same regardless which gain stage is selected, i.e., irrespective of gain stage selected, the input impedance of the circuit of FIG. 3 is fixed (constant).

This similarly applies to the output side. Since only the selected gain stage is in ON state and other gain stages are in OFF state, the output impedance is constant at all times. For this reason, it is sufficient that matching circuits are the same regardless of which gain stage is selected in the circuit of FIG. 3, it is enough to respectively provide matching circuits on the input side and on the output side. Therefore, it is unnecessary to prepare a large number of matching circuits as in the case of the circuit shown in FIG. 1.

Individual circuits at respective gain stages of FIG. 3 may be, e.g., an emitter-grounded amplifier 30 as shown in FIG. 7, or may be an attenuator 31 in which resistance elements 32a–32c are connected in π form as shown in FIG. 8. The circuit form, the magnitude of gain, and magnitude of quantity of attenuation are arbitrary. Generally, dimensions of these circuits are about 100 $\mu m^2$ at the best. On the other hand, in a matching circuit using typical passive element in which a capacitor 33 and an inductor 34 are connected in series as shown in FIG. 9, the inductor 34 and capacitor 33 respectively have great area more than several hundreds $\mu m^2$ and 100 $\mu m^2$. Accordingly, in the case of the circuit of FIG. 3, since only circuits less than 100 $\mu m^2$ are only provided in respective stages, the number of matching circuits which occupy large area can be reduced, and the chip area can be reduced.

Moreover, FIG. 10 shows an example where the circuit of FIG. 3 is used as a radio receiver 35. A receiving signal inputted from an antenna section 1 is converted into a base band signal by a frequency converter 3 through a band-pass filter 2. The base band signal thus obtained is converted into speech/picture data, etc. by a signal processing unit 5. The signal processing unit 5 judges magnitude of signal amplitude. In the case where the signal processing unit 5 detects changes (fluctuation) of the level of a receiving signal, it outputs a control signal to control unit (not shown) of a variable gain circuit 36 in the manner of having the above-mentioned configuration or the like. When the radio receiver receives, e.g., a signal of amplitude value of a predetermined level or more, the signal processing unit 5 outputs a control signal to allow quantity of attenuation of signal amplitude to be large. In the case where the signal processing unit 5 cannot detect a signal of amplitude value of a predetermined level, it outputs a control signal to allow attenuation quantity of signal amplitude to be small.

In the gain switching circuit using this invention, since the input impedance and the output impedance both match with 50 ohms, antenna and/or filter disposed before and after the gain switching circuit indicate satisfactory characteristics, and there results no unnecessary reflection taking place.

The circuit shown in FIG. 11 is of a structure comprising gain stage blocks 20A, 20B, . . . , and 20N connected in parallel so that output impedance values of circuits nearest to the output side (output sections 23a, 23b, . . . and 23n) of respective gain stage blocks 20A, 20B, . . . , and 20N are caused to be equal to each other at all the gain stages. In order to select gain stage 20A in this circuit, only the gain stage 20A is caused to be turned ON, and other all gain stages are caused to be turned OFF. Thus, the output impedance of the circuit of FIG. 11 becomes equal to a value when output impedance of one circuit nearest to the output side in ON state and output impedance of (n−1) circuits nearest to the output side in OFF state are connected in parallel. Accordingly, the output impedance is constant (fixed) even if a particular gain stage is selected.

Similarly, in the circuit of FIG. 12, the input impedance becomes constant even if any of gain stages 20A, 20B, . . . , or 20N are selected. Namely, circuits nearest to the input side (input sections 21a, 21b, . . . , and 21n) of respective gain stage blocks 20A, 20B, . . . , and 20N are adapted so that input impedance values are equal to each other at all gain stages and are used to provide a configuration comprising these circuits connected in parallel so that the input impedance becomes constant.

Variations (Unevenness) of the manufacturing process of the semiconductor will not be considered. In a circuit as shown in FIG. 3, variations in the input impedance or the output impedance of respective gain stages individually take place at respective gain stage blocks. Accordingly, the input impedance or the output impedance of the entirety of the circuit shown in FIG. 3 would vary in accordance with which gain stage is selected. On the contrary, the circuit including gain stage blocks 40A, 40B, . . . , 40N shown in FIG. 13 is of a structure in which circuits nearest to the input side (input sections 41a, 41b, . . . , and 41n) and circuits nearest to the output side (output sections 43a, 43b, . . . , and 43n) of all gain stage blocks 40A, 40B, . . . , and 40N are caused to have the same circuit configuration and the same circuit constants. When such an approach is employed, input impedance values of the circuits nearest to the input side and output impedance values of the circuits nearest to the output side vary (fluctuate) while carrying out tracking with respect to variations of the process. For this reason, irrespective of gain stage selected, the input impedance and the output impedance of the entirety of the circuit shown in FIG. 13 become constant. Numerals 42a, 42b, . . . , 42n denote amplifying sections in the gain stage blocks 40A, 40B, . . . , 40N.

In the circuit shown in FIG. 14, circuits nearest to the input side (input sections 44a, 44b, 44c, . . . , and 44n) and circuits nearest to the output side (46a, 46b, 46c, . . . , 46n) of all gain stage blocks (45A, 45B, 45C, . . . , and 45N) are caused to have the same circuit configuration and the same circuit constants, the portions except for the above are respectively constituted by using the same circuits, and differences between gains prescribing amplification factors of respective gain stages are determined by varying the number of stages of circuits connected. With respect to the input impedance and the output impedance of this circuit, similarly to the case of the circuit of FIG. 13, they are constant regardless of which gain stage is selected. Moreover, in FIG. 14, the gain difference between gain stage 45A and gain stage 45B becomes equal to magnitude $\underline{A}$ of unit gain of unit gain block 47a, . . . , or 4 mn, and gain difference between gain stage 45B and gain stage 45C also becomes equal to $\underline{A}$. Namely, with respect to variations of the process, characteristics of individual circuits constituting respective gain stages change while carrying out tracking. For this reason, gain differences between respective gains stages become equal to $\underline{A}$. With respect to gain differences between respective gain stages, it is possible to precisely provide gain differences by the step of magnitude $\underline{A}$ of unit gain at all times. Accordingly, the final gain stage block 45N includes intermediate gain section 47n through 4 mn at m stages.

Figure 15:
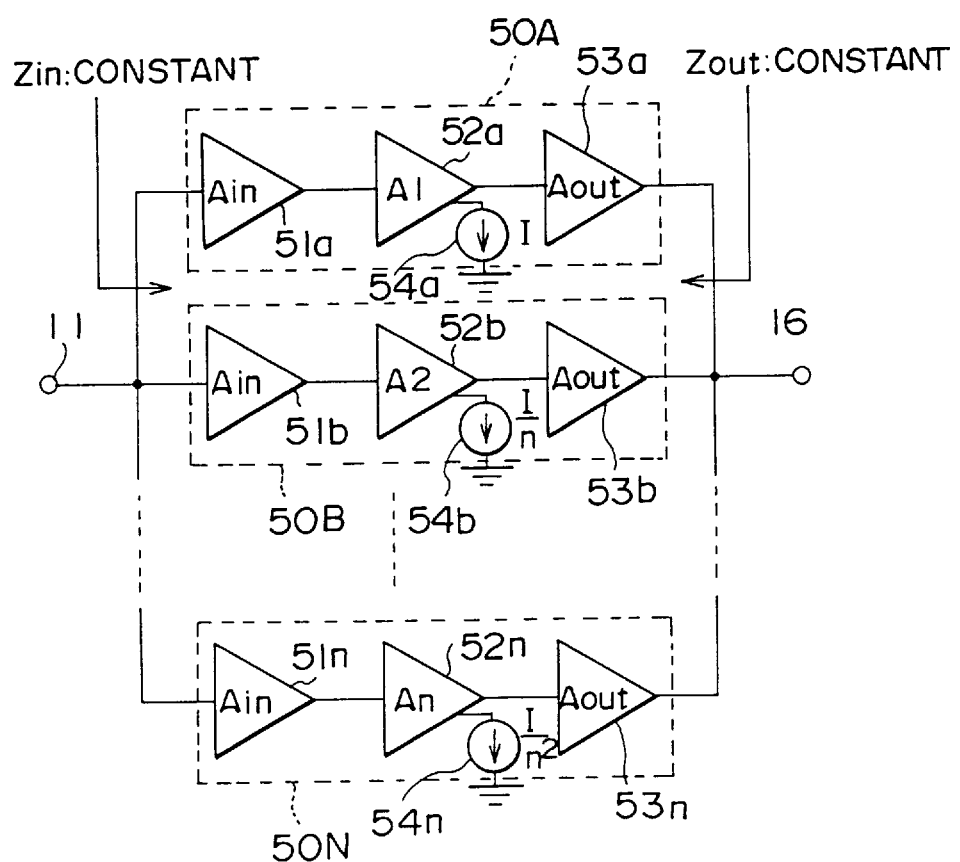
FIG. 15 is a view showing the configuration of a fifth application example of the variable gain circuit of this invention.

Moreover, the circuit of FIG. 15 is adapted so that circuits nearest to the input side (51a, 51b, 51c, . . . , and 51n) and circuits nearest to the output side (53a, 53b, 53c, . . . , and 53n) of all gain stage blocks 50A, 50B, 50C, . . . , and 50N are caused to have the same circuit configuration and the same circuit constants, portions of amplifying sections 52a, 52b, . . . , and 52n are respectively constituted by using circuits of the same configuration, and difference of gains between respective gain stages are determined by prescribing a way of giving bias current delivered to the circuits of the amplifying sections. That is, the gain stage blocks 50A–50N respectively comprise current sources 54a, 54b, . . . , 54n. Accordingly, when sizes of devises, e.g., transistors used in current sources for determining bias currents are changed to determine bias values of respective gain stages, values of biases of respective gain stages fluctuate while carrying out tracking with respect to variations. In this case, since gain of the amplifier is generally proportional to bias, it is possible to keep constant gain differences between respective gain stages of the circuit of FIG. 15 similarly to the case of the circuit of FIG. 14.

Next, there will be described a detailed circuit configuration of each type of the variable gain circuits in accordance with FIGS. 16 through 18.

Figure 16:
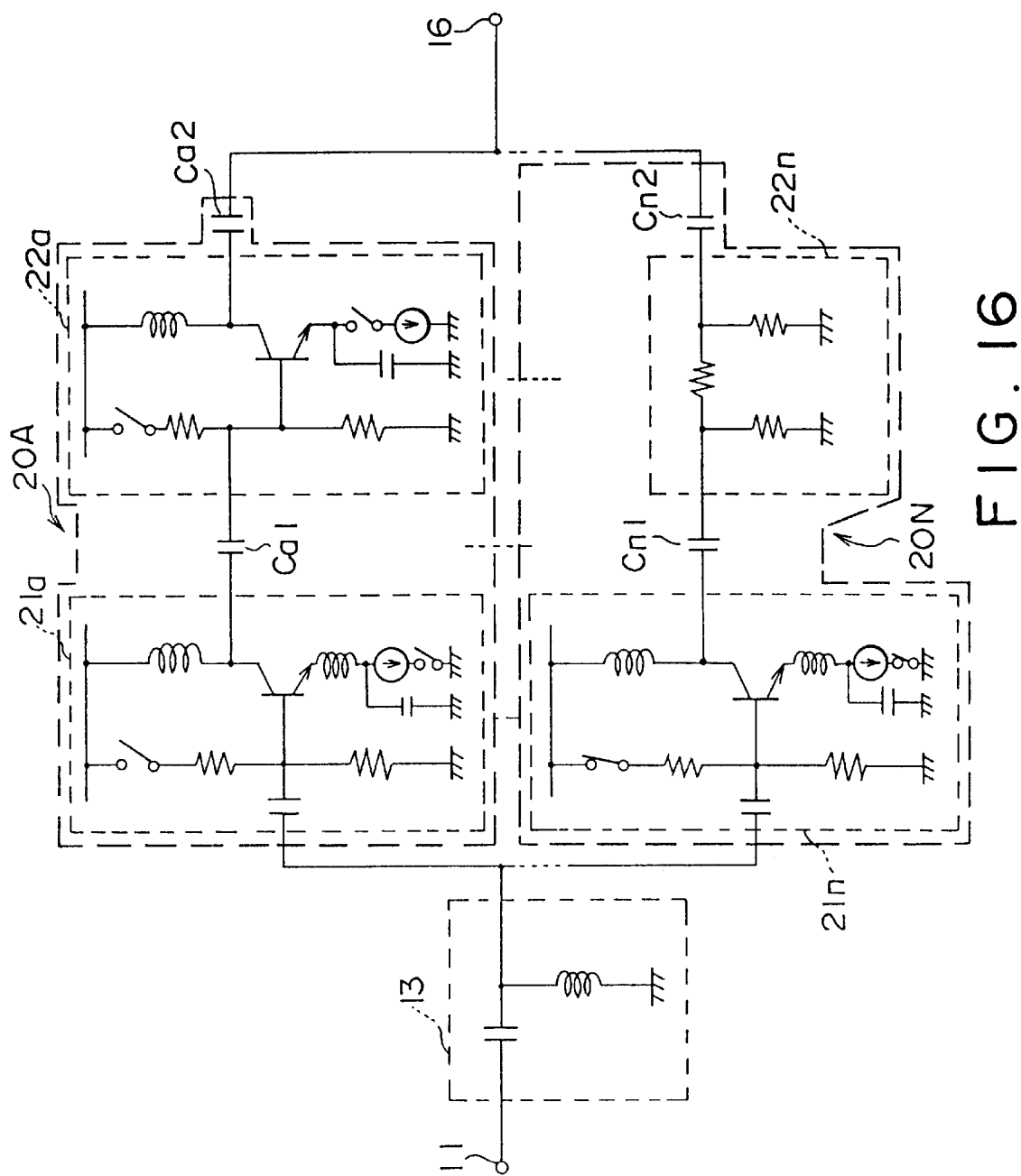
FIG. 16 is a circuit diagram showing a first circuit example of the variable gain circuit according to the present invention.

FIG. 16 is a circuit diagram showing a variable gain circuit according to a first concrete example including a matching circuit on an input terminal side. The variable gain circuit of the first example corresponds to the circuit shown in FIG. 12, and comprises an input side matching circuit 13, and a plurality of gain stage blocks 20A through 20N. The gain stage block 20A comprises an input amplifier section 21a, capacitors Ca1 and Ca2, and an amplifier section 22a, and the gain stage block 20N comprises an input section 21n, capacitors Cn1 and Cn2, and an attenuator section 22n. The matching circuit 13 is comprised of an LC circuit.

In the above configuration, since the input amplifier stages of the first through N-th gain stage blocks have the same configuration, the amplifier stages 21a through 21n have the same input impedance value viewed from the input terminal 11. Since the circuit 22a is the amplifier and the circuit 22n is the attenuator, both the circuits generally have different output impedance value, respectively. Accordingly, in this example, an impedance matching is performed only on the input side in accordance with the present invention.

Figure 17:
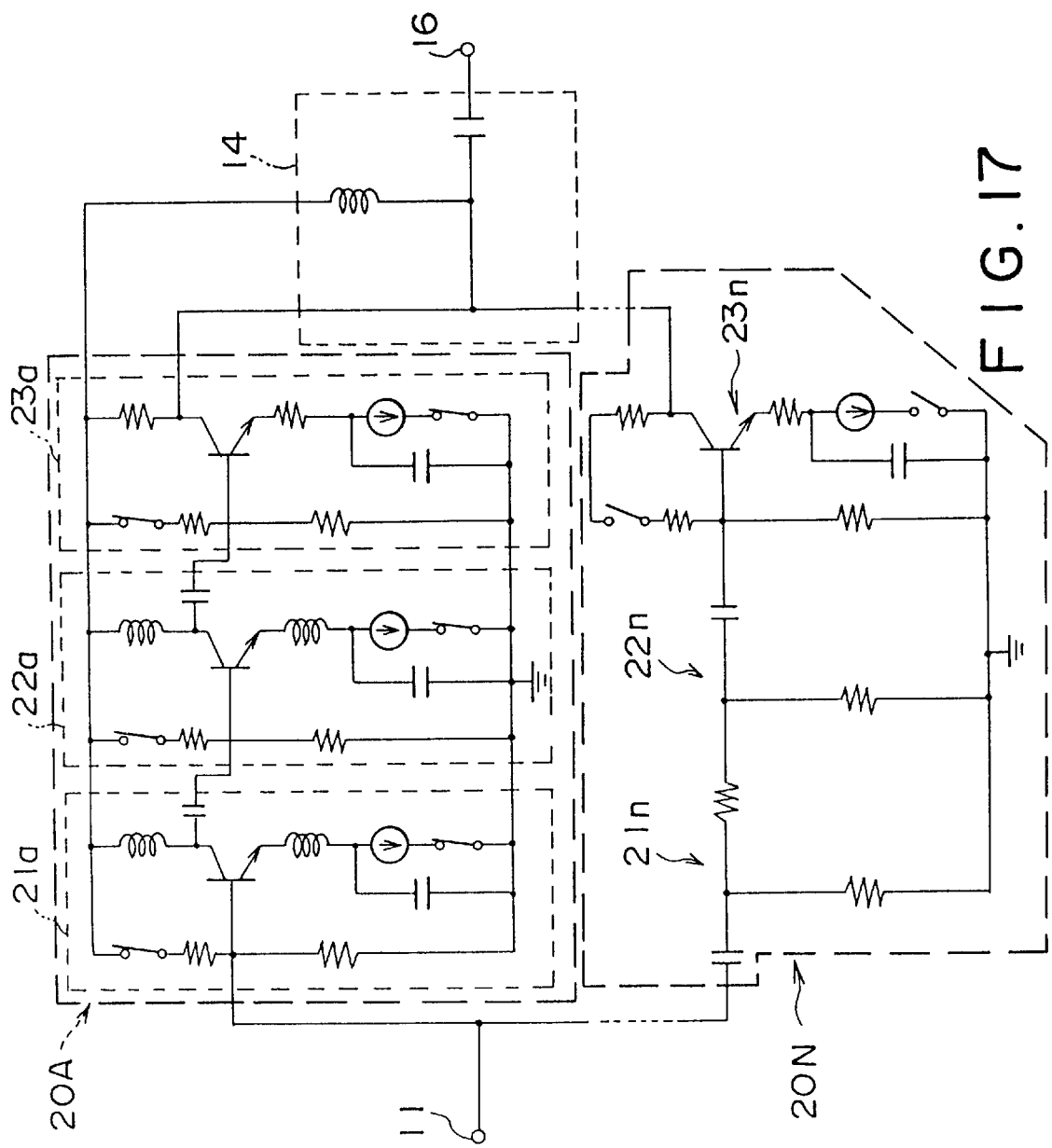
FIG. 17 is a circuit diagram showing a second circuit example of the variable gain circuit according to the present invention.

FIG. 17 is a circuit diagram showing a variable gain circuit according to a second concrete example including a matching circuit on an output side. The variable gain circuit of the second example corresponds to the circuit shown in FIG. 11, and comprises a plurality of gain stage blocks 20A through 20N connected in parallel with one another, and an output side matching circuit 14. The first gain stage block 20A comprises an input stage 21a, amplifier stage 22a and output stage 23a, and the N-th gain stage block 20N comprises a section 21n, 22n and 23n. The matching circuit 14 is also comprised of an LC circuit.

Figure 18:
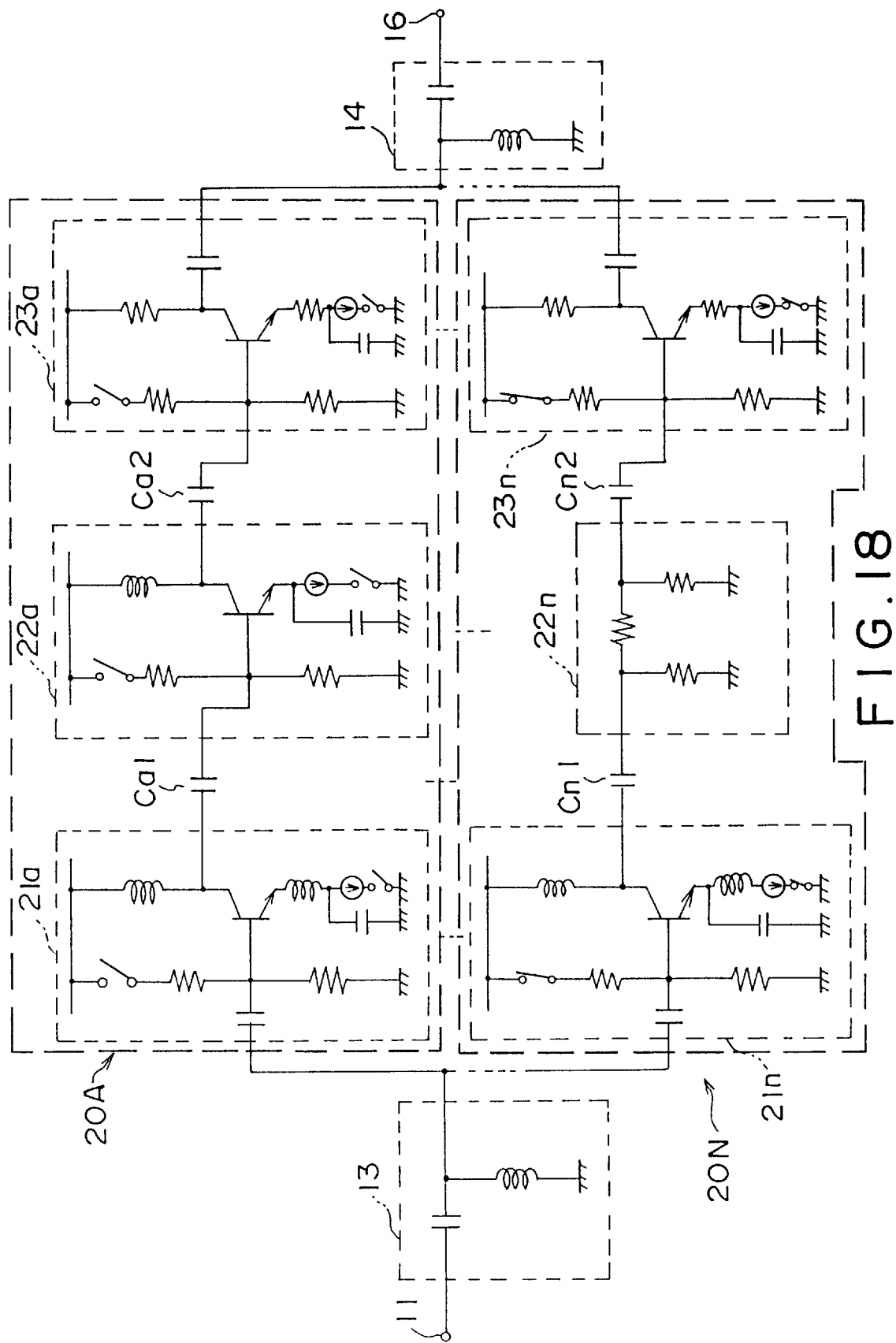
FIG. 18 is a circuit diagram showing a third circuit example of the variable gain circuit according to the present invention.

FIG. 18 is a circuit diagram showing a variable gain circuit according to a third concrete example including matching circuits on both input and output sides. The variable gain circuit of the third example corresponds to the circuit shown in FIG. 3, and comprises matching circuits 13 and 14, and a plurality of first through N-th gain stage blocks 20A through 20N. The first gain stage block 20A comprises an input stage 21a, amplifier stage 22a and output stage 23a, and capacitors Ca1 and Ca2. The N-th gain stage block 20N comprises an input stage 21n, attenuator stage 22n and output stage 23n, and capacitors Cn1 and Cn2. The matching circuits 13 and 14 are respectively comprised on an LC circuit.

Here, there is described a schematic operation of the variable gain circuit according to the second example with reference to FIGS. 19 and 20. FIG. 19 is an equivalent circuit diagram of the gain circuit shown in FIG. 17. In FIG. 19, the gain stages are comprised of the first and second gain stages which respectively have a dynamic range as follows.

Generally, the lower limit of the dynamic range of the amplifier is determined by a noise characteristic, and the upper limit of the dynamic range is determined by a distortion characteristic when the amplifier includes active elements (transistors). Accordingly, when the gain circuit is comprised of an active element such as the amplifier stage block 20A shown in FIG. 17, the block 20A has a dynamic range between −100 dBm and −25 dBm without noise and distortion characteristics of the amplifier. Here, the amplifier 23n shown in FIG. 19 has the dynamic range from −100 dBm to −25 dBm as a single body.

On the other hand, when the signal is attenuated by the attenuator stage block 20N having a π type resistors, as shown in FIG. 19, the attenuator 20N attenuates the signal level with 20 dB from an input signal having −100 dBm which is originally sufficient to an amplifier single body, so that the signal level is buried in the noise level, thereby disabling the receiver to receive the input signal. Accordingly, when the attenuator is provided at the initial stage such as the circuit FIG. 17 (FIG. 19), the dynamic range becomes narrower with an attenuated component, that is, 20 dB.

On the contrary, when the large amount of the signal power is supplied, it is advantageous with the attenuated component by the initial stage attenuator. For example, even though the signal having the level of −25 dBm which is a limit value receivable to the amplifier single body without distortion is supplied, it is possible to receive the signal with a predetermined margine because the attenuator attenuates the signal level with 20 dB. Accordingly, the upper limit of the dynamic range seems to be broadened with an attenuated amount of the attenuator. This principle can be shown in FIG. 20.

Here, in a personal handyphone system (PHS) for example, the dynamic range is required for the signal reception from −100 dBm to +5 dBm.

Accordingly, if −25 dBm is the original upper limit of the dynamic range in the amplifier, 30 dB is necessary as the attenuated amount to receive the signal of +5 dBm in accordance with the following equation:

$$-25-5=-30 \text{ (dB)}.$$

Therefore, the attenuation amount is necessary for about 30 dB. However, since the amplifier block and attenuator block respectively have the different distortion and noise characteristics and attenuator block has an extreme distortion characteristic, the upper limit of the dynamic range is improved. Accordingly, 20 dB may be attenuated actually to obtain the sufficient signal reception.

The stage number of the variable gain stage blocks is generally two stages, the difference of the individual stages may be sufficient to be about 30 dB. When the variable gain circuits is configured in the multistage blocks, proper margines are provided between the adjacent two blocks, respectively.

Figure 21:
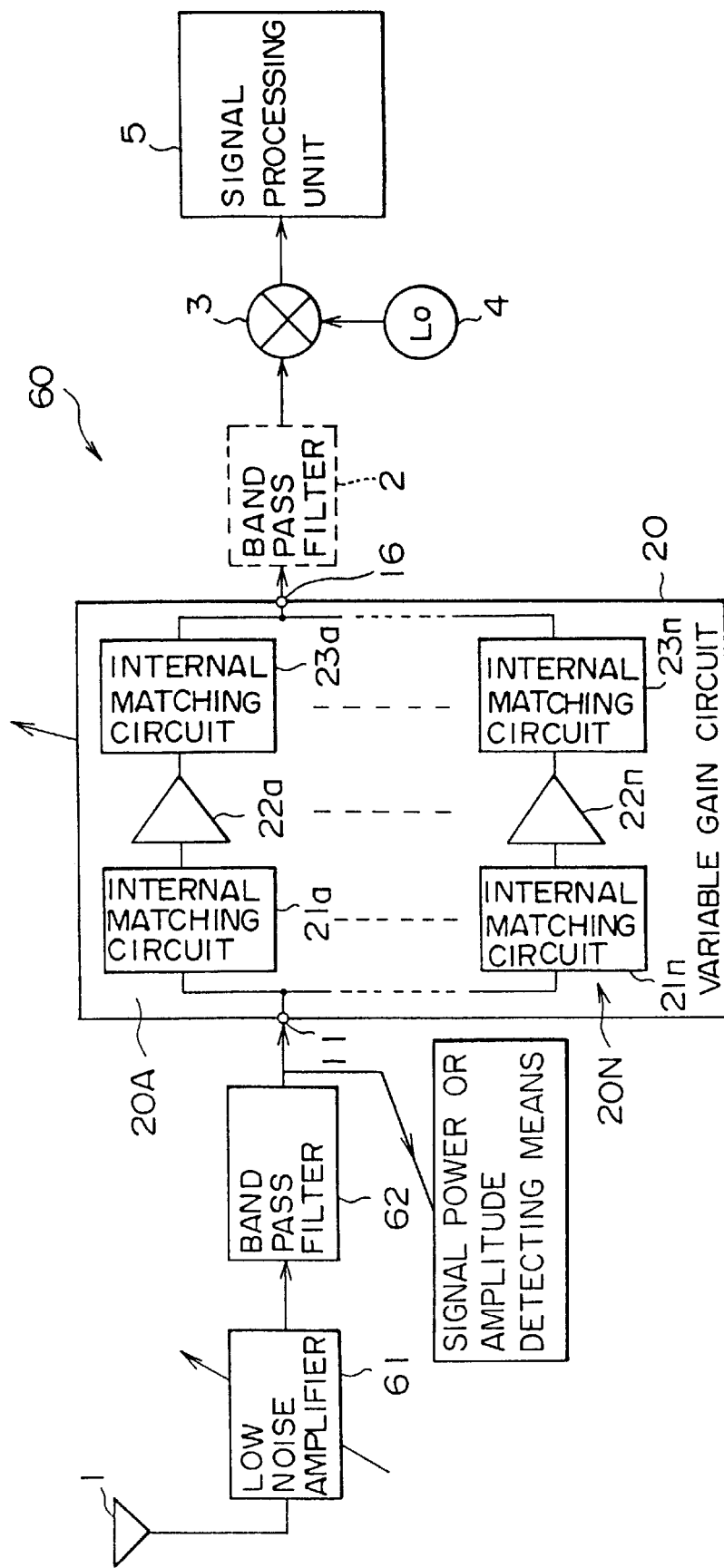
FIG. 21 is a block diagram showing a configuration of a radio apparatus according to the present invention.

Finally, there is described a radio apparatus according to a preferred embodiment of the present invention with reference to FIG. 21. In FIG. 21, the duplicated description will be omitted with respect to components having the same numerals in FIG. 1.

The radio apparatus 60 comprises an antenna 1, a low noise amplifier 61, band-pass filter 62. Variable gain circuit 20, band-pass filter 2, frequency converter 3, local oscillator 4, and signal processing unit 5. It is possible for such a constitution to obtain the optimum reception signal by changing over the optimum gain by the variable gain circuit. The low noise amplifier 61 and band-pass filter 62 may constitute a reception circuit for receiving the input signal through the antenna 1.

What is claimed is:

1. A radio apparatus adapted for receiving data by performing a frequency conversion of a receiving signal from a radio frequency into a base band frequency to perform a predetermined signal processing, said apparatus at least comprising:

an input terminal;

an output terminal;

a plurality of gain stages directly connected in parallel between said input terminal and said output terminal; and signal processing means for controlling a change-over from one of the plurality of gain stages to another of the plurality of gain stages corresponding to said receiving signal of the radio frequency.

2. The radio apparatus according to claim 1, wherein an input impedance value of one of the plurality of gain stages viewed from said input terminal is substantially equal to another input impedance value of another of the plurality of gain stages connected in parallel.

3. The radio apparatus according to claim 1, wherein an output impedance value of one of the plurality of gain stages viewed from said output terminal is substantially equal to another output impedance value of another of the plurality of gain stages connected in parallel.

4. The radio apparatus according to claim 1, wherein
an input impedance value of one of the plurality of gain stages viewed from said input terminal is substantially equal to another input impedance value of another of the plurality of gain stages connected in parallel, and an output impedance value of one of the plurality of gain stages viewed from said output terminal is substantially equal to another output impedance value of another of the plurality of gain stages connected in parallel.

5. The radio apparatus according to claim 1, wherein
said radio apparatus further comprises a signal power detection means for detecting signal power of said receiving signal of said radio frequency; and
said signal processing means controls said change-over corresponding to said signal power of said receiving signal of the radio frequency.

6. The radio apparatus according to claim 5, wherein
said signal power detection means further comprises an amplitude detection means for detecting an amplitude value of said receiving signal of the radio frequency; and
said signal processing means controls said change-over corresponding to said amplitude value of said receiving signal of the radio frequency.

7. A variable gain circuit comprising:
an input terminal;
an output terminal;
a plurality of gain stages directly connected in parallel between the input terminal and the output terminal;
a control unit for allowing said plurality of gain stages to be selectively operative;
an input side matching circuit having an input side, an input impedance value viewed from said input side and representing an input impedance of the variable gain circuit, and an output connected in series to said input terminal; and
an output side matching circuit having an input connected in series to said output terminal, an output side, and an output impedance value viewed from said output side and representing an output impedance of the variable gain circuit.

8. The variable gain circuit according to claim 7, wherein each of said plurality of gain stages comprises:
an input stage for inputting a high frequency signal;
at least one amplifier stage, connected in series to said input stage, for outputting an amplified signal; and
an output stage, connected in series to said at least one amplifier stage.

9. The variable gain circuit according to claim 7, wherein the input impedance value is substantially the same regardless of which of the plurality of gain stages are operative.

10. The variable gain circuit according to claim 7, wherein the output impedance value is substantially the same regardless of which of the plurality of gain stages are operative.

11. A variable gain circuit comprising:
an input terminal;
an output terminal;
a plurality of gain stages, directly connected in parallel between the input terminal and the output terminal, each having an input stage, at lest one amplifier stage, and an output stage connected in series; and
a control unit for allowing said plurality of gain stages to be selectively operative;
wherein each output stage of the plurality of gain stages is caused to have substantially the same circuit configuration and substantially the same circuit constants as any other of the plurality of gain stages, such that an input impedance viewed from said input terminal remains substantially the same regardless of which of the plurality of gain stages are operative; and
wherein each output stage of the plurality of gain stages is caused to have substantially the same circuit configuration and substantially the same circuit constants as any other of the plurality of gain stages, such that an output impedance viewed from said output terminal remains substantially the same regardless of which of the plurality of gain stages are operative.

* * * * *